(12) United States Patent
Jin et al.

(10) Patent No.: US 11,671,292 B2
(45) Date of Patent: Jun. 6, 2023

(54) SIGNAL PROCESSING CIRCUIT IMPROVING LINEARITY OF PULSE AMPLITUDE MODULATED SIGNAL AND COMMUNICATION DEVICE INCLUDING THE CIRCUIT

(71) Applicant: QUALITAS SEMICONDUCTOR CO., LTD., Seoul (KR)

(72) Inventors: Tae Hwan Jin, Yongin-si (KR); Jae Young Kim, Seoul (KR); Duho Kim, Seoul (KR)

(73) Assignee: QUALITAS SEMICONDUCTOR CO., LTD., Seoul (KR)

( * ) Notice: Subject to any disclaimer, the term of this patent is extended or adjusted under 35 U.S.C. 154(b) by 0 days.

(21) Appl. No.: 17/498,613

(22) Filed: Oct. 11, 2021

(65) Prior Publication Data
US 2023/0088200 A1    Mar. 23, 2023

(30) Foreign Application Priority Data
Sep. 17, 2021    (KR) ......... 10-2021-0124475

(51) Int. Cl.
*H03F 3/16*    (2006.01)
*H04L 27/04*    (2006.01)
*H03F 1/32*    (2006.01)

(52) U.S. Cl.
CPC .......... *H04L 27/04* (2013.01); *H03F 1/3205* (2013.01); *H03F 3/16* (2013.01)

(58) Field of Classification Search
CPC .......... H01J 40/14; H03F 1/3205; H03F 3/16; H03F 3/45; H03M 3/00; H04B 1/06; H04B 10/12; H04B 10/58; H04B 10/524; H04L 25/03; H04L 25/34; H04L 27/04
USPC ...... 330/252; 359/125, 189, 341.1; 375/219, 375/229, 286, 295–297, 300, 316, 318
See application file for complete search history.

(56) References Cited

U.S. PATENT DOCUMENTS 10,797,658 B1 * 10/2020 Raj .................. H03F 3/3022
2005/0133692 A1 * 6/2005 Watanabe ........... G02B 21/008
250/214 A

FOREIGN PATENT DOCUMENTS

KR    10-2017-0130510 A    11/2017
KR    10-2019-0047712 A    5/2019

* cited by examiner

*Primary Examiner* — Shawkat M Ali
(74) *Attorney, Agent, or Firm* — Broadview IP Law, PC

(57) ABSTRACT

A circuit for processing an N-level pulse amplitude modulation (PAM-N) signal according to an embodiment of the present invention comprises: an input unit receiving an input signal; a main amplifier connected to the input unit to amplify the input signal with a first gain; and an output unit outputting an output signal of the main amplifier, and the circuit further comprises an auxiliary amplifier connected in parallel with the main amplifier between the input unit and the output unit to variably amplify at least a portion of the input signal and apply the signal to the output unit according to a linearity improvement control signal corresponding to the output signal.

9 Claims, 11 Drawing Sheets

SIGNAL PROCESSING CIRCUIT IMPROVING LINEARITY OF PULSE AMPLITUDE MODULATED SIGNAL AND COMMUNICATION DEVICE INCLUDING THE CIRCUIT

BACKGROUND OF THE INVENTION

Field of the Invention

The present invention relates to a pulse amplitude modulation signal processing circuit and a communication device including the same. More specifically, the present invention relates to a PAM signal processing circuit for improving linearity of a pulse amplitude modulation signal, and a communication device including the same.

Background of the Related Art

The optical interconnect solution is emerging as a solution to increase of data traffic explosively increasing recently, and the optical interconnect solution has already replaced copper-based interconnect networks in long-distance and metropolitan communication networks. The applicable area of the optical interconnect solution is gradually expanding with the increase in bandwidth and development of optical communication technologies. One of the representative forms that provide a medium or long-distance optical interconnect solution for the optical connection solution is optical transceivers.

With the development of latest technologies such as high-definition TV (HDTV), video on demand (VoD), high-speed Internet, Internet of Things (IoT) and the like, optical transceivers propose various high-level pulse modulation signal processing techniques to satisfy the requirements for high-capacity interconnect networks.

Particularly, a 4-level pulse amplitude modulation (PAM-4, Pulse Amplitude Modulation-4) encoding method has an advantage of doubling the bit rate compared to serial data, and providing more transitions as the voltage level is increased to four levels.

However, although the high-level pulse modulation signal should be ideally a linear signal distributed at equal intervals, there is a chronic problem in that the linearity is degraded when the signal passes through an amplifier.

Figure 1:
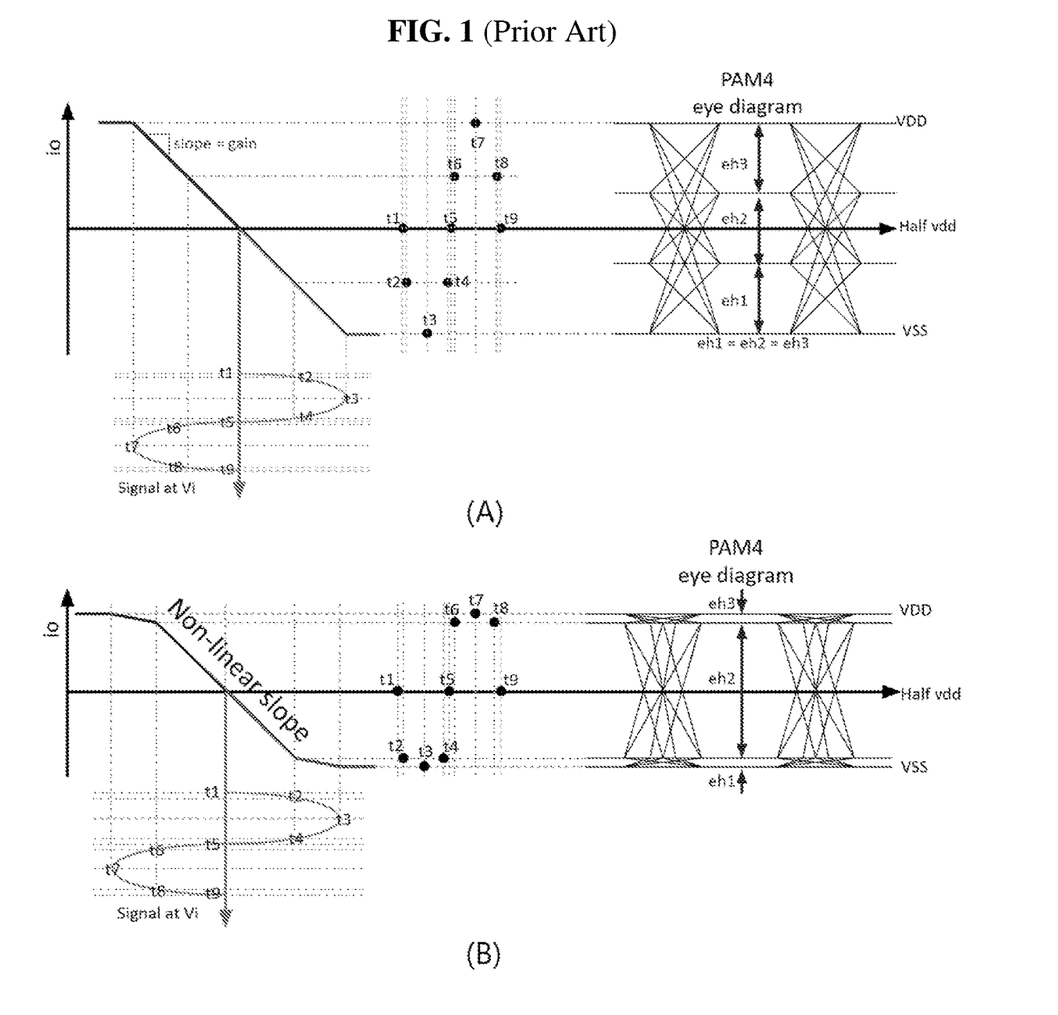
FIG. 1 is a view for explaining a conventional technique.

FIG. 1(A) is a view showing the linearity of a 4-level pulse modulation signal PAM-4 that has passed through an amplifier in an ideal case, and FIG. 1(B) is a view showing a non-linearly amplified realistic 4-level pulse modulation signal PAM-4.

As shown in FIG. 1(A), in an ideal case, the eye height (EH) between voltage levels of the PAM-4 signal should be uniformly formed. However, a realistic amplifier operates as shown in FIG. 1(B). This is based on the variability of the voltage level of the transceiver and partial nonlinearity of the amplifier. The slope changes according to the degree of deviation from the operating region, and accordingly, the eye height between the voltage levels of the PAM-4 signal is not uniform.

Particularly, as the voltage level of the PAM-4 signal is getting closer to VDD and VSS, the linear coefficient of the amplifier is also lowered, and thus the shape of the slope also gradually changes to be gentler.

Non-linearity of a system has a problem of degrading communication sensitivity as the bit error ratio (BER) of transmission and reception signals increases, and lowering data processing speed and overall communication speed due to error correction.

SUMMARY OF THE INVENTION

Therefore, the present invention has been made in view of the above problems, and it is an object of the present invention to provide a pulse amplitude modulation signal processing circuit for improving linearity of a pulse amplitude modulation signal, and a communication device including the same, which can lower the BER, improve communication sensitivity and data processing speed, and also improve communication speed, by improving linearity of a circuit that processes N-level pulse amplitude modulation (PAM-N) signals.

To accomplish the above object, according to one aspect of the present invention, there is provided a circuit for processing an N-level pulse amplitude modulation (PAM-N) signal, the circuit comprising: an input unit for receiving an input signal; a main amplifier connected to the input unit to amplify the input signal with a first gain; and an output unit for outputting an output signal of the main amplifier, wherein the circuit further comprises an auxiliary amplifier connected in parallel with the main amplifier between the input unit and the output unit to variably amplify at least a portion of the input signal and apply the signal to the output unit according to a linearity improvement control signal corresponding to the output signal.

According to an embodiment of the present invention for solving the above problems, there is provided a communication device for receiving a PAM-4 signal through an optical communication network, the communication device comprising: a pulse amplitude modulation signal processing circuit for calibrating linearity by processing a 4-level pulse amplitude modulation (PAM-4, Pulse Amplitude Modulation N) signal; and a communication module for performing communication based on a signal, linearity of which is calibrated by the pulse amplitude modulation signal processing circuit, wherein the pulse amplitude modulation signal processing circuit includes: an input unit for receiving an input signal; a main amplifier connected to the input unit to amplify the input signal with a first gain; and an output unit for outputting an output signal of the main amplifier, wherein the circuit further comprises an auxiliary amplifier connected in parallel with the main amplifier between the input unit and the output unit to variably amplify at least a portion of the input signal and apply the signal to the output unit according to a linearity improvement control signal corresponding to the output signal.

Meanwhile, the method according to an embodiment of the present invention for solving the above problems may be implemented as a computer-readable program for executing the method in a computer, and the program.

DETAILED DESCRIPTION OF THE PREFERRED EMBODIMENT

Hereinafter, only the principles of the present invention will be described. Therefore, although not explicitly described or shown in the specification, those skilled in the art may implement the principles of the present invention and invent various devices included in the spirit and scope of the present invention. In addition, it should be understood that all the conditional terms and examples listed in the specification are clearly intended only to understand the concept of the present invention in principle, and not limited to the embodiments and states specially listed like this.

In addition, it should be understood that all detailed descriptions listing specific embodiments, as well as the principles, aspects, and embodiments of the present invention, are intended to include structural and functional equivalents of such matters. In addition, it should be understood that such equivalents include equivalents that will developed in the future, as well as currently known equivalents, i.e., all devices invented to perform the same function regardless of the structure.

Therefore, for example, the block diagrams in the specification should be understood as expressing the conceptual viewpoints of illustrative circuits that embody the principles of the present invention. Similarly, all flowcharts, state transition diagrams, pseudo code, and the like may be practically embodied on computer-readable media, and it should be understood that regardless of whether or not a computer or processor is explicitly shown, they show various processes performed by the computer or processor.

Functions of various elements shown in the figures including a processor or functional blocks expressed as a concept similar thereto may be provided by the use of hardware having an ability to execute software in association with appropriate software, as well as dedicated hardware. When provided by a processor, the functions may be provided by a single dedicated processor, a single shared processor, or a plurality of individual processors, some of which may be shared.

In addition, explicit use of the terms presented as processors, controls, or concepts similar thereto should not be interpreted by exclusively quoting hardware having an ability of executing software, and should be understood to implicitly include, without limitation, digital signal processor (DSP) hardware, and ROM (ROM), RAM (RAM) and non-volatile memory for storing software. Other known common hardware may also be included.

In the claims of this specification, components expressed as a means for performing the functions described in the detailed description are intended to include, for example, combinations of circuit elements performing the functions or all methods that perform the functions including all forms of software such as firmware/microcode and the like, and are combined with suitable circuits for executing the software to perform the functions. Since the present invention defined by the claims is combined with the functions provided by the various listed means and combined with the method requested by the claims, it should be understood that any means capable of providing the functions are equivalent to those grasped from the specification.

The above objects, features and advantages will become more apparent through the following detailed description related to the accompanying drawings, and accordingly, those skilled in the art may easily implement the technical spirit of the present invention. In addition, when it is determined in describing the present invention that the detailed description of a known technique related to the present invention may unnecessarily obscure the gist of the present invention, the detailed description thereof will be omitted.

Hereinafter, a preferred embodiment according to the present invention will be described in detail with reference to the accompanying drawings.

Figure 2:
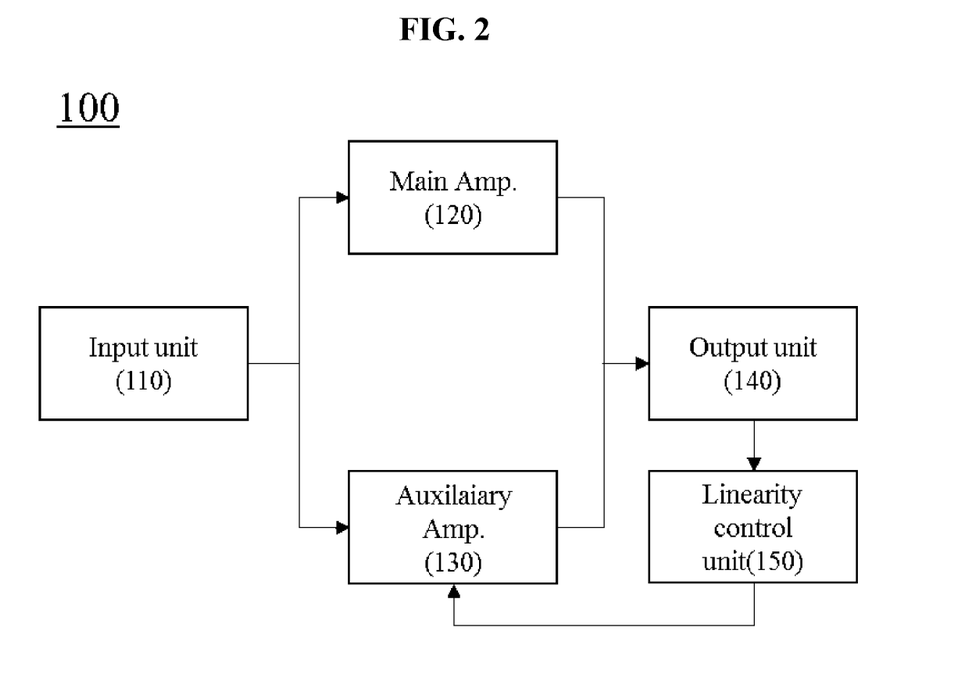
FIG. 2 is a block diagram showing a circuit according to an embodiment of the present invention.

FIG. 2 is a block diagram showing a circuit according to an embodiment of the present invention.

Referring to FIG. 2, a circuit according to an embodiment of the present invention may be an amplification circuit that receives, amplifies and outputs an N-level pulse amplitude modulation (PAM-N) signal, and the N-level pulse amplitude modulation (PAM-N) signal is an amplitude modulation signal having a plurality of amplitude levels, and preferably, an amplification processing circuit for 4-level pulse amplitude modulation (PAM-4) may be exemplified.

The circuit according to an embodiment of the present invention may be referred to as a pulse amplitude modulation signal processing circuit 100, and a separate communication module (not shown) is provided to be connected to the pulse amplitude modulation signal processing circuit 100 and perform communication using a signal processed by the pulse amplitude modulation signal processing circuit 100 to improve linearity, and may be implemented as a communication device for optical signals or the like.

In addition, the pulse amplitude modulation signal processing circuit 100 according to an embodiment of the present invention includes, as shown in FIG. 2, an input unit 110, a main amplifier 120, an auxiliary amplifier 130, an output unit 140, and a linearity control unit 150.

First, the input unit 110 may include an input terminal for receiving an input signal of a pulse amplitude modulation signal from the outside. The input signal of the input terminal may be referred to as Vi.

In addition, the main amplifier 120 is connected to the input unit 110 and performs a function of a general amplifier for amplifying the input signal with a first gain. An output signal of the main amplifier may be expressed as, for example, a current signal such as io.main.

In addition, the output unit 140 is a terminal for outputting the output signal of the main amplifier, and may be a node terminal forming output signal Vo.

In addition, according to an embodiment of the present invention, the pulse amplitude modulation signal processing circuit 100 further includes the auxiliary amplifier 130 connected in parallel with the main amplifier 120 between the input unit 110 and the output unit 140 to variably amplify at least a portion of the input signal and apply the signal to the output unit 140 according to a linearity improvement control signal corresponding to the output signal.

The auxiliary amplifier 130 may be connected in parallel with the main amplifier 120 as shown in FIG. 2.

Then, the pulse amplitude modulation signal processing circuit 100 may further include the linearity control unit 150 for measuring a preset operating signal level variable from the output signal of the output unit 140, generating the linearity improvement control signal based on the operating signal level variable, and applying the linearity improvement control signal to the auxiliary amplifier.

The operating signal level variable may be calculated based on the voltage levels of the PAM-4 signal and the eye height between the voltage levels. For example, the voltage levels of the PAM-4 signal may correspond to V1, V2, V3, and V4, and the eye height between the voltage levels may correspond to V2-V1 (EH1, Eye Height 1), V3-V2 (EH2, Eye Height 2), and V4-V3 (EH3, Eye Height 3), respectively.

As EH1, EH2, and EH3 should be calibrated to be equal in order to improve the linearity, the linearity improvement control signal may include a control signal for finely shifting the operating point of the auxiliary amplifier 130 in each voltage region in a direction equally calibrating the eye heights between the voltage levels.

The auxiliary amplifier 130 may include an amplifier circuit formed based on a MOSFET (Metal-Oxide-Semiconductor Field-Effect Transistor) device that changes the operating point based on the linearity improvement control signal to shift the operating point. The MOSFET device is preferably formed by combining an N-type MOSFET (NMOS) and a P-type MOSFET (PMOS), and various types of circuits of the auxiliary amplifier 130 may be configured according to the connection form. In this regard, each circuit embodiment will be described in more detail with reference to FIGS. 3 to 9.

Figure 3:
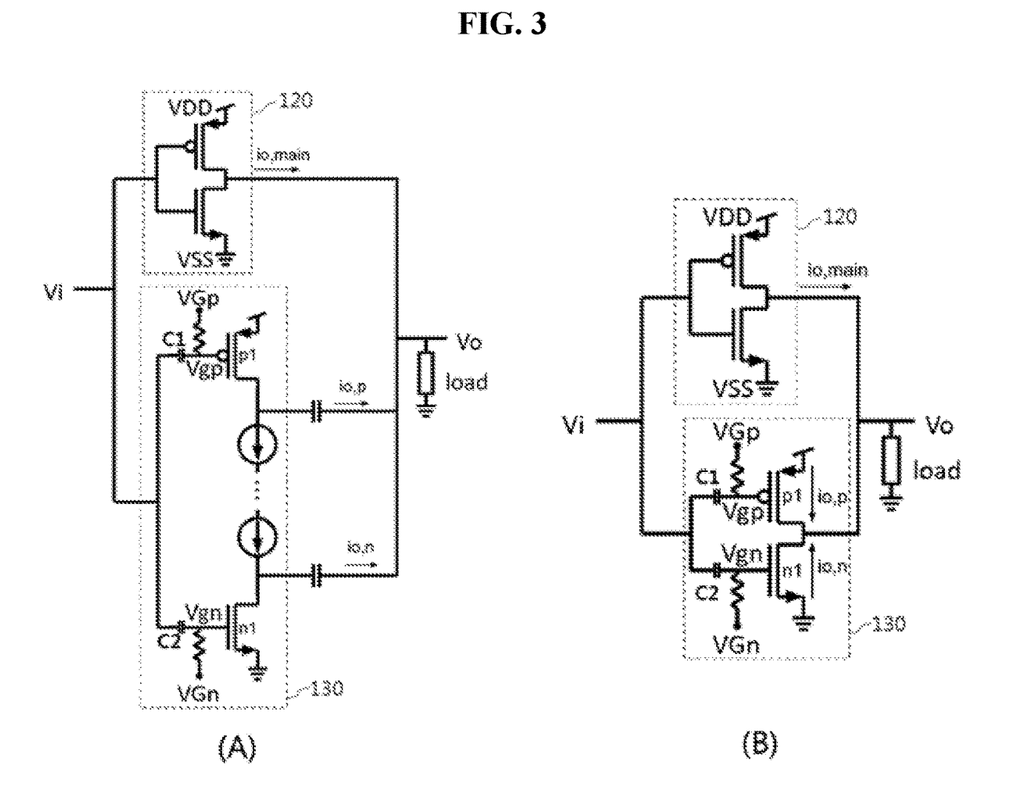
FIG. 3 is a view showing a circuit schema according to an embodiment of the present invention.

FIG. 3 is a view showing a circuit schema according to an embodiment of the present invention.

Referring to FIG. 3, the pulse amplitude modulation signal processing circuit 100 according to an embodiment of the present invention may be configured in the form of receiving an input signal Vi of the input unit 110 and outputting an output current io.main of the main amplifier 120 to the output unit 140, and the auxiliary amplifier 130 is an amplifier circuit connected in parallel with the main amplifier 120, and may include a first capacitor C1 and a second capacitor C2 for decoupling the DC component of the signal input from the input unit 110, and an NMOS device and a PMOS device connected thereto, respectively.

In the NMOS and PMOS devices, output currents io.p and io.n are formed respectively by p1 and n1 biased as the gate voltages VGp and VGn are calibrated according to the linearity improvement control signal described above, and the output signal Vo output through the output unit 140 to have improved linearity is finally output through the output terminal.

FIG. 3(A) shows a schema in which NMOS and PMOS circuits are individually configured, and drain outputs io.p and ip.n are separately connected to the output unit 140, and FIG. 3(B) shows a schema showing a case of configuring a complementary Metal-Oxide Semiconductor (CMOS) inverter in the form of complementarily combining the NMOS and the PMOS.

In the case of FIG. 3(A), the auxiliary amplifier 130 may be provided with a first capacitor C1 and a second capacitor C2, one end of which is connected to the input unit 110, connected to each other in parallel to decouple the DC voltage of the input signal. The PMOS circuit has a gate connected to the other end of the first capacitor C1, and may receive a first bias voltage formed based on the decoupled input signal and the linearity improvement control signal VGp through the gate, and variably amplify and output the PMOS drain current io.p to the output unit. The NMOS circuit has a gate connected to the other end of the second capacitor C2, and may receive a second bias voltage formed based on the decoupled input signal and the linearity improvement control signal VGn through the gate, and variably amplify and output the NMOS drain current io.n to the output unit.

In addition, it operates similarly in the case of FIG. 3(B), and the auxiliary amplifier 130 may include a CMOS inverter circuit complementarily connecting an NMOS and a PMOS, the drains of which are connected to the output unit 140, and receives the first bias voltage and the second bias voltage based on the decoupled input signal of the input unit 110 and the linearity improvement control signal through the gates respectively to variably control the current of the drains.

As shown in FIG. 3, as the auxiliary amplifier 130 according to an embodiment of the present invention is configured of a system coupling circuit of PMOS and NMOS or a CMOS inverter circuit, the gate voltage operating point of the PMOS device and the gate voltage operating point the NMOS device may be controlled to shift by amplifying, in a direction linearly correcting the regions (regions adjacent to VDD and VSS) in which nonlinearity of the main amplifier 120 is generated.

Figure 4:
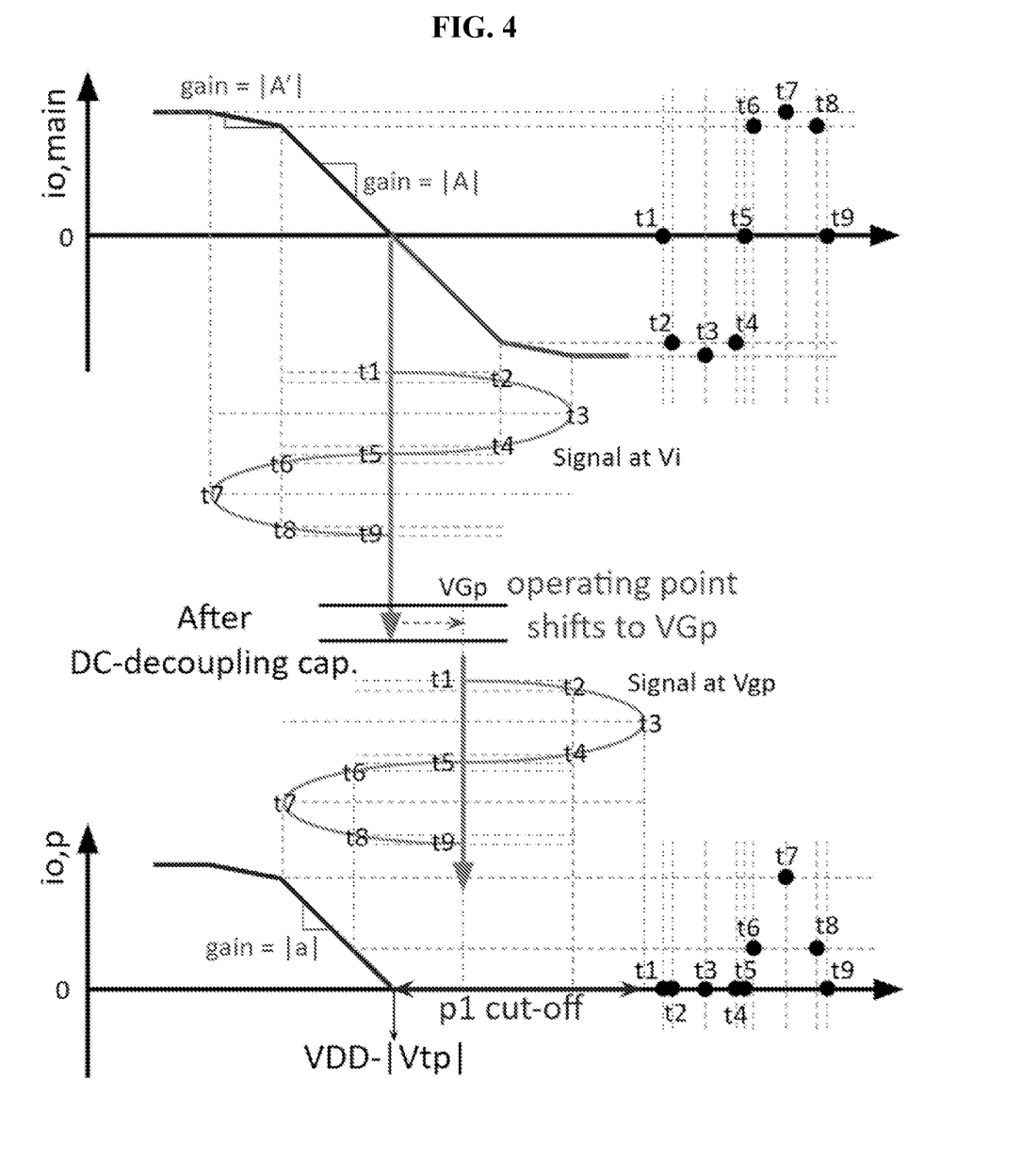
FIGS. 4 and 5 are views for explaining that linearity is improved by a changed operating point according to an embodiment of the present invention.
Figure 5:
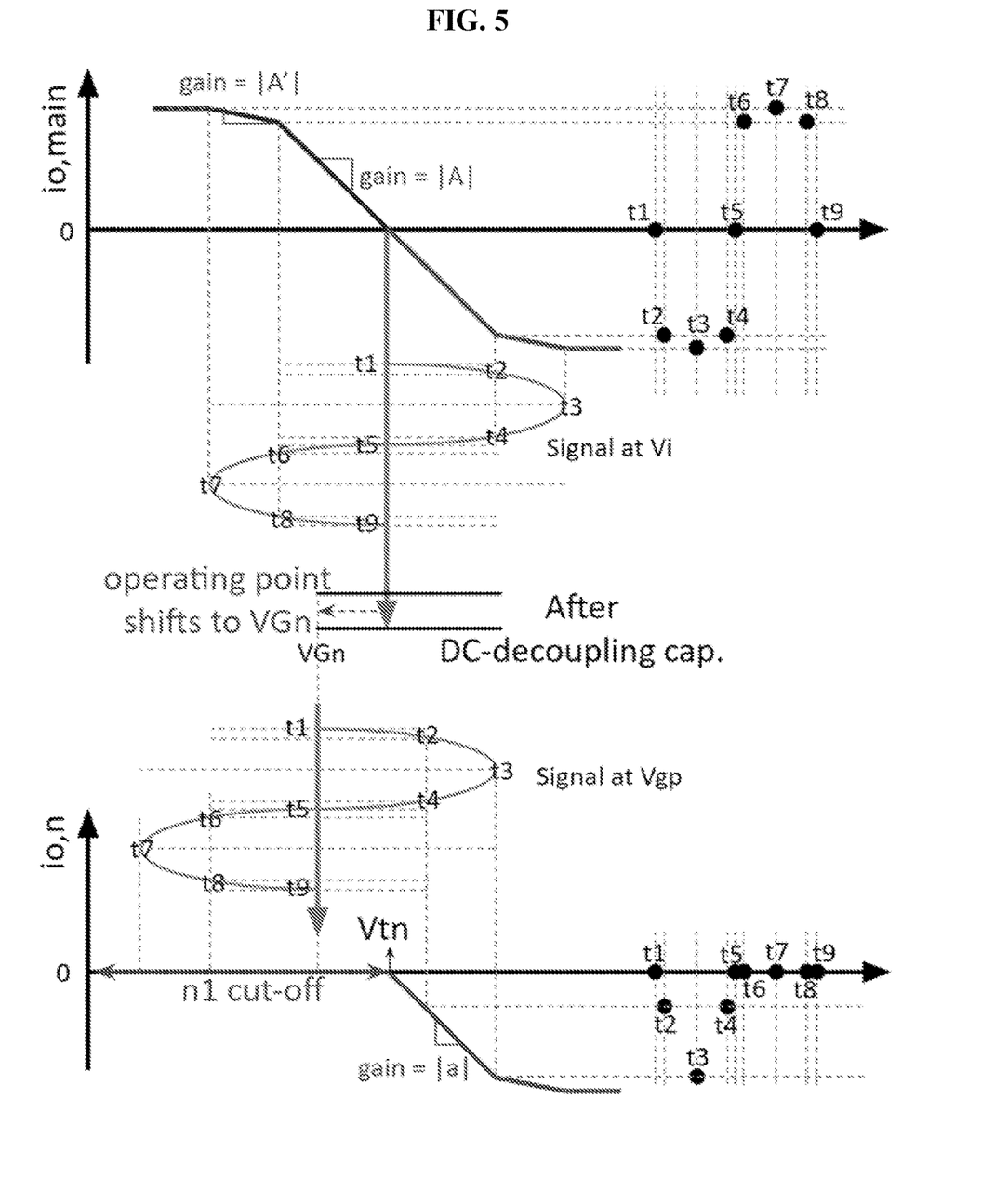

FIGS. 4 and 5 are views for explaining that linearity is improved by a changed operating point according to an embodiment of the present invention.

More specifically, the operating points of the PMOS p1 and the NMOS n1 may be formed by variably applying voltage to the gate according to the linearity improvement control signal of the linearity control unit 150.

In order to generate the linearity improvement control signal, the linearity control unit 150 may measure the operating signal level variable of the output unit 140. The operating signal level variable includes the voltage levels V1, V2, V3, and V4 and the eye heights EH1, EH2, and EH3 between the voltage levels described above, and the linearity improvement control signal may be determined by the VDD (drain power) voltage and VSS (source power) voltage variables of the main amplifier 120 and threshold voltages (Vtp and Vtn) of the PMOS and NMOS.

First, since the auxiliary amplifier 130 should process cutoff for the linear region of the main amplifier 120, the condition of p1, which is formed by applying VGp to the gate of the PMOS, to get out of the cutoff region and enter the amplification region may be Vgp<VDD−Vtp, and the condition of p1 to enter the cutoff region may be Vgp>VDD−Vtp. Here, Vgp may be a combined signal that forms a first bias p1 as the input signal Vi decoupled by the decoupling capacitor C1 described above and the linearity improvement control signal VGp of the linearity control unit 150 are overlapped.

Contrarily, the condition of n1, which is formed by applying VGn to the gate of the NMOS, to get out of the cutoff region and enter the amplification region may be Vgn>VSS+Vtn, and the condition of n1 to enter the cutoff region may be Vgn<VSS+Vtn. Here, Vgn may be a combined signal that forms a second bias n1 as the input signal Vi decoupled by the decoupling capacitor C2 described above and the linearity improvement control signal VGn of the linearity control unit 150 are overlapped.

Accordingly, referring to FIGS. 4 and 5, the auxiliary amplifier 130 may cut off the operating point not to operate in the cutoff voltage section where the first gain A of the main amplifier 120 is linearly formed, and linearity improvement control signals VGn and VGp corresponding thereto may be generated by the linearity control unit 150 and applied to the gates of the NMOS and PMOS, respectively.

In addition, the auxiliary amplifier 130 may perform a process of shifting the operating point to amplify a signal of a section exceeding the cutoff voltage section of the main amplifier 120 with the first gain A, and linearity improvement control signals VGn and VGp corresponding thereto may be generated by the linearity control unit 150 and applied to the NMOS and PMOS gates, respectively.

According to the processing as described above, it is possible to overcome the limitation of the main amplifier 120 having a nonlinear gain A' in a section other than the cutoff region. As shown in FIGS. 4 and 5, the output of the main amplifier 120 has a problem in that the voltage in the linear amplification sections t1 to t2, t4 to t6, and t8 to t9 is amplified with gain |A|, and the voltage in the sections t2 to t4 and t6 to t8 out of the linear amplification sections is amplified with low gain |A'|.

However, the auxiliary amplifier 130 according to an embodiment of the present invention may select a nonlinear amplification section and a linear amplification section using setting of the cutoff section, and process so that p1 may amplify the voltage between t6 and t8 with the first gain of |A| and n1 may amplify the voltage between t2 and t4 with |A|, by changing the operating point corresponding to a signal getting out of the linear amplification section.

In addition, for the processing as described above, the linearity control unit 150 may perform a signal operation for generating a variable control signal for applying bias voltages of the PMOS (p1) and the NMOS (n1) according to VGp and VGn and processing an appropriate system operation according to the output signal of the output unit 140. Accordingly, the linearity control unit 150 may further include one or more measurement sensors and microprocessors for processing the operation.

Figure 6:
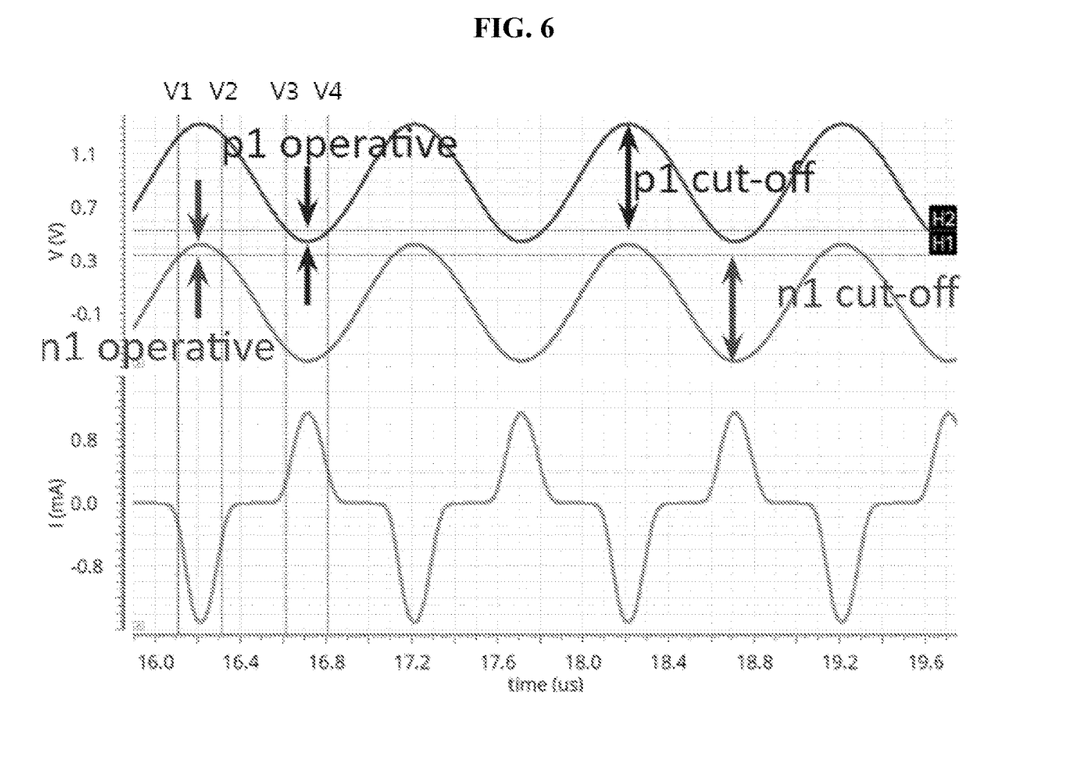
FIGS. 6 to 8 are views for explaining an operating point and a cutoff range according to an embodiment of the present invention.
Figure 7:
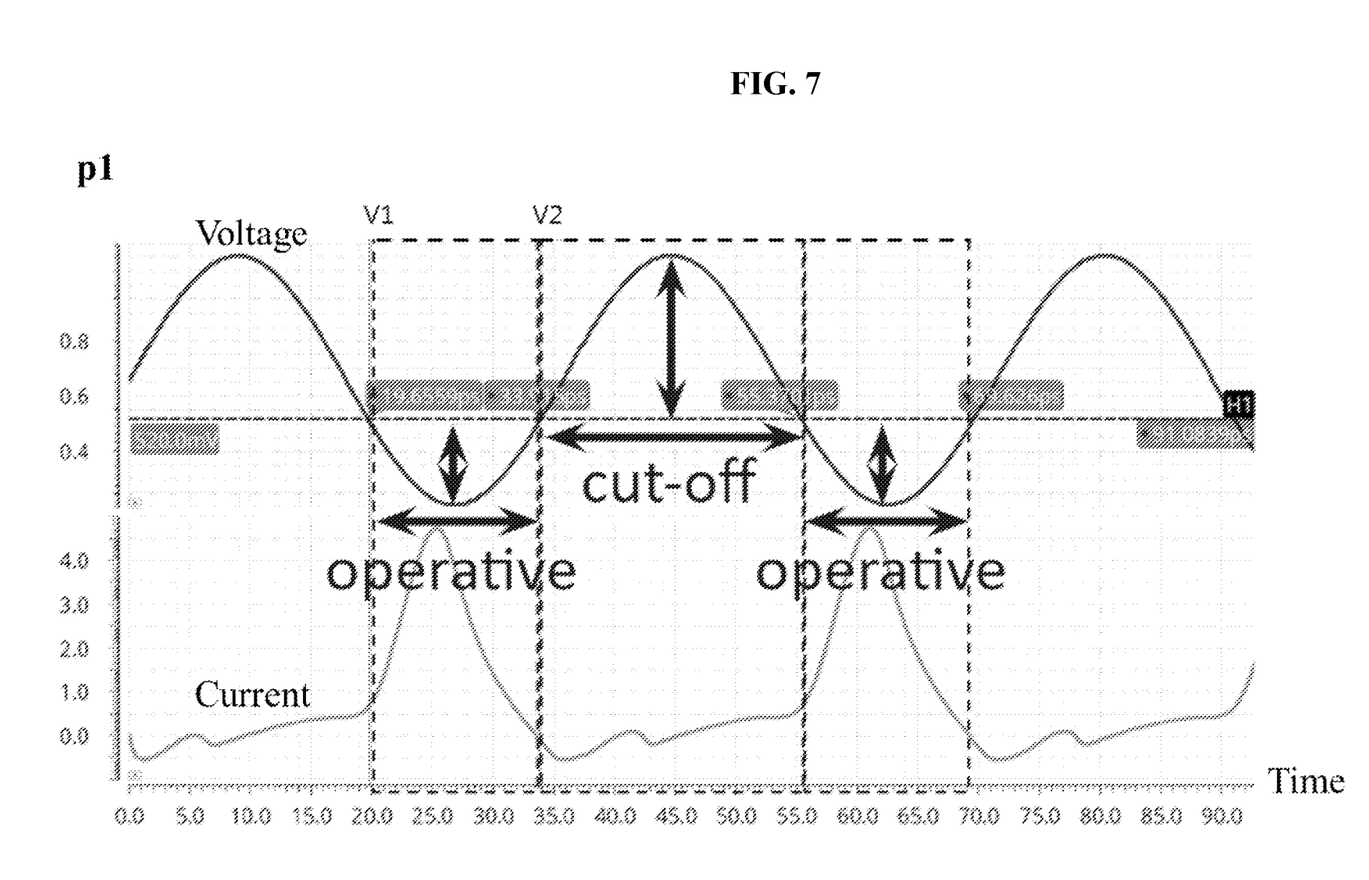
Figure 8:
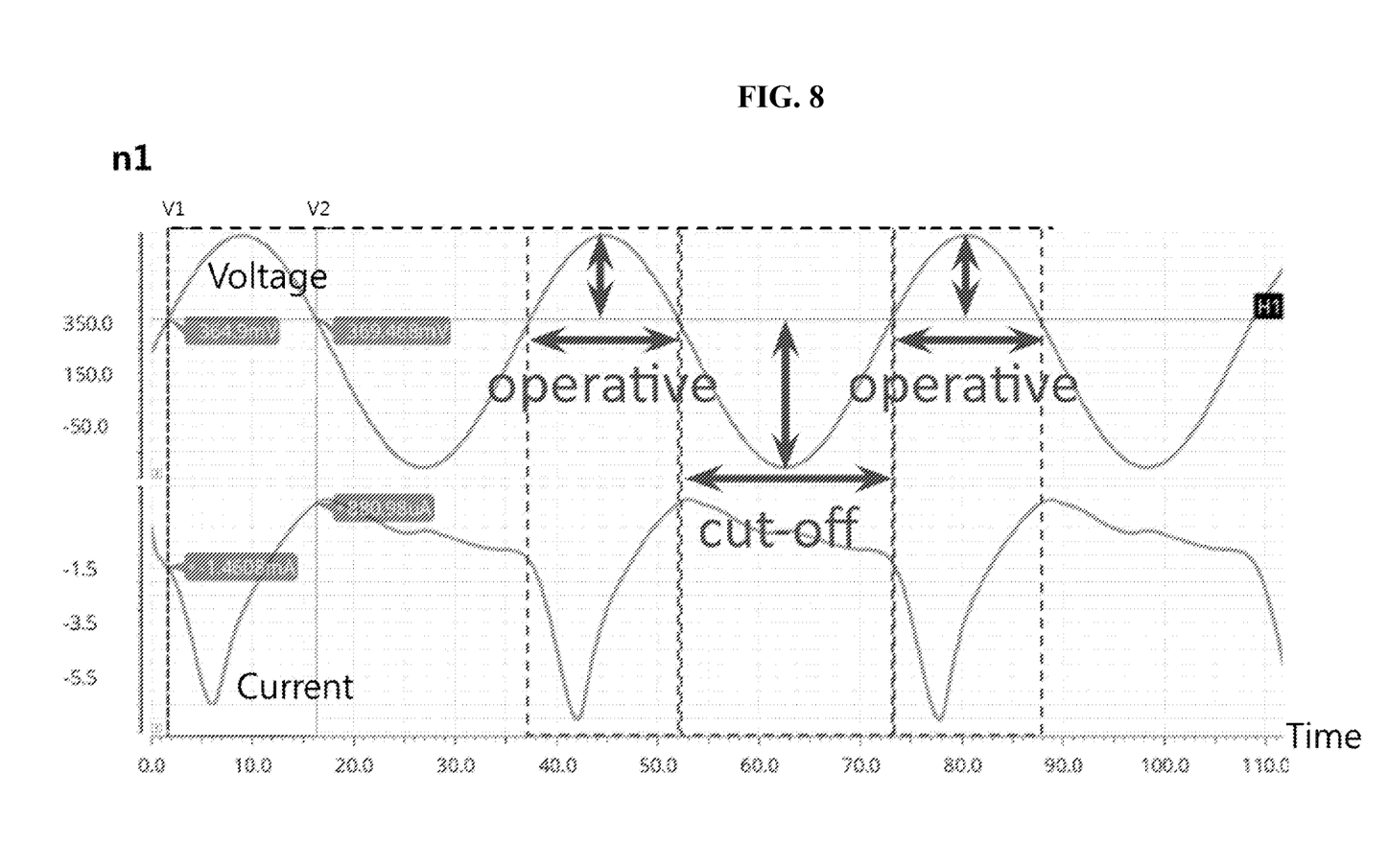

FIGS. 6 to 8 are views for explaining an operating point and a cutoff range according to an embodiment of the present invention.

Referring to FIG. 6, FIG. 6 is a graph showing a simulation result when a circuit schema is configured as shown in FIG. 3(A). n1 and p1 should be controlled so that the output current is ideally formed to be 0 when both the NMOS and the PMOS of the auxiliary amplifier 130 are in a cutoff state, and the linearity control unit 150 may dynamically apply VGn and VGp as linearity improvement control signals for this purpose as time flows.

In addition, current io.n that is output when the PMOS is in a cutoff state and the NMOS is in operation and current io.p that is output when the NMOS is in a cutoff state and the PMOS is operation should be formed in opposite directions, and the linearity control unit 150 may dynamically apply VGn and VGp as linearity improvement control signals for this purpose as time flows.

Furthermore, as the cutoff regions and the operating regions of p1 and n1 are determined by the threshold voltages Vtn and Vtp of the NMOS and the PMOS of the auxiliary amplifier 130 and VDD and VSS of the main amplifier 120, respectively, FIG. 6 shows that the operating regions and the cutoff regions are formed through a voltage graph.

In addition, referring to FIGS. 7 and 8, the graphs show a simulation result when an inverter type circuit schema is configured as shown in FIG. 3(B), and it can be confirmed that the operating region and the cutoff region of the auxiliary amplifier 130 are formed based on the voltage for the PMOS (p1) and the NMOS (n1), respectively. In the graphs, it can be confirmed that the upper curve shows change in voltage, the lower curve shows change in current, and it can be confirmed that p1 and n1 operate in a range outside the cutoff region, respectively.

Figure 9:
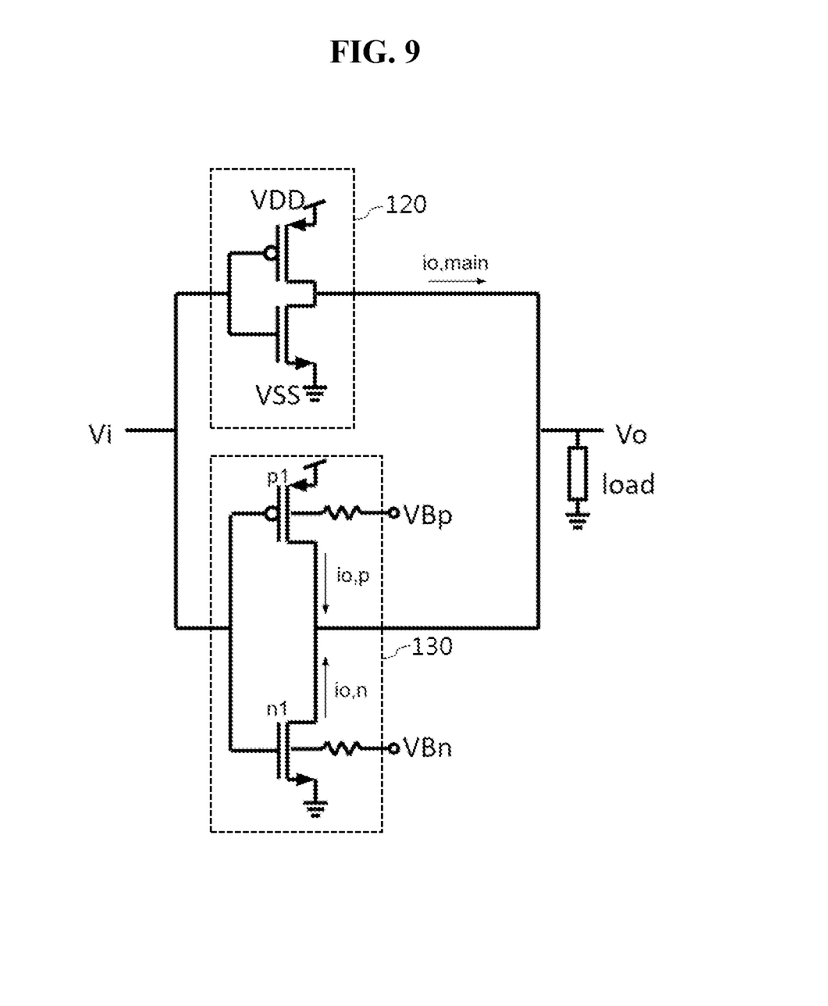
FIG. 9 is a view showing another circuit schema according to another embodiment of the present invention.

FIG. 9 is a view showing another circuit schema according to another embodiment of the present invention.

Referring to FIG. 9, the auxiliary amplifier 130 according to another embodiment of the present invention is connected between the input unit 110 and the output unit 140 without separate decoupling capacitance, and may include an operating point shift circuit that combines the NMOS and the PMOS, in which a threshold voltage is varied as bulk voltage based on the linearity improvement control signal is applied.

In this case, as shown in FIG. 9, the linearity control unit 150 may control VBp according to application of bulk voltage. As a result, since the effective operating point is a point obtained by subtracting the threshold voltages Vtp and Vtn from the gate voltage, the linearity control unit 150 according to an embodiment of the present invention may obtain a result that improves the linearity as the operating point is changed by applying a control signal for calibrating the threshold voltages Vtp and Vtn of each of the NMOS and PMOS devices. In this case, since it can be implemented without separate decoupling capacitance, the size and production cost of the module can be reduced.

Figure 10:
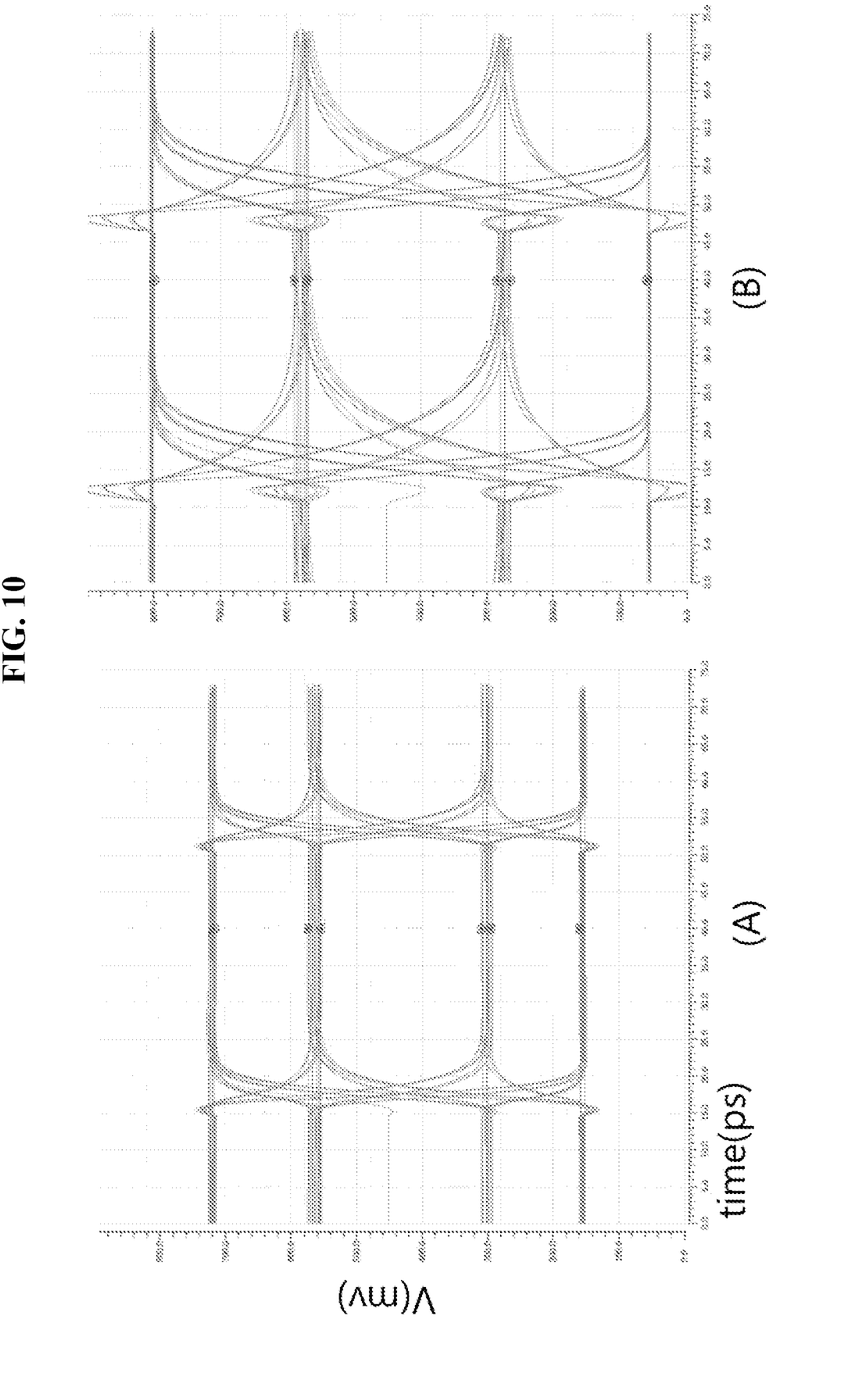
FIG. 10 is a graph showing a result of a comparative experiment compared with the conventional technique according to an embodiment of the present invention.

FIG. 10 is a graph showing a result of a comparative simulation compared with the prior art according to an embodiment of the present invention.

As shown in FIG. 10(A), a pulse amplitude modulation signal processing circuit using only a conventional simple amplifier has a problem in that the eye heights EH1, EH2, and EH3 between voltage levels are formed not uniformly, and the eye height in the middle is large.

However, from the circuit schema according to the embodiment of the present invention and a test result implementing the circuit schema, it can be confirmed that the upper and lower eye heights are formed similarly compared to the eye height in the middle as shown in FIG. 10(B), and accordingly, it can be clearly confirmed that linearity of the signal is also improved.

Figure 11:
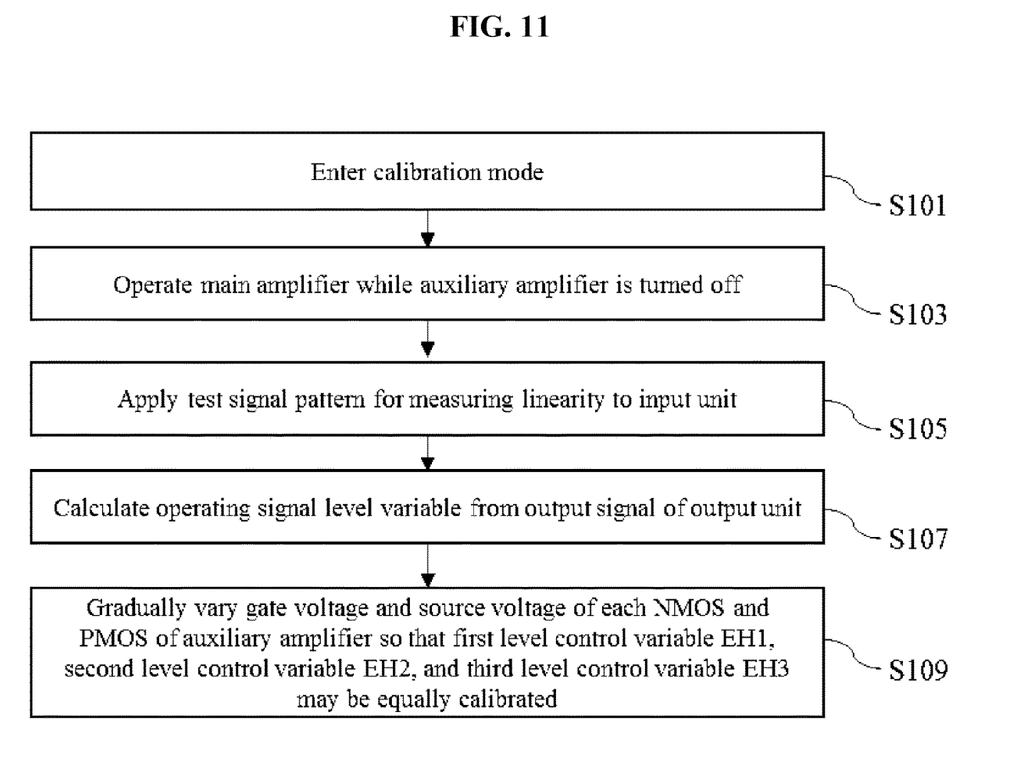
FIG. 11 is a flowchart illustrating a calibration operation of a circuit according to an embodiment of the present invention.

FIG. 11 is a flowchart illustrating a calibration operation of a circuit according to an embodiment of the present invention.

As shown in FIG. 11, the linearity control unit 150 according to an embodiment of the present invention may enter a calibration mode and calibrate variable setting of the auxiliary amplifier 130 for smooth operation of the auxiliary amplifier 130.

To this end, the linearity control unit 150 confirms entering the calibration mode according to a user input or a predetermined condition (S101).

Then, the linearity control unit 150 operates the main amplifier 120 first while the auxiliary amplifier 130 is turned off (S103).

Since the auxiliary amplifier 130 is turned off in this state, the linearity control unit 150 may set VGp and VSp (voltages of PMOS source side) to be equal, and may also set VGn and VSn (voltages of NMOS source side) to be equal.

Thereafter, the linearity control unit 150 applies a test signal pattern for measuring linearity to the input unit 110 (S105).

Here, the linearity may be used to calculate value A, which is a first gain of the main amplifier 120.

Then, the linearity control unit 150 calculates an operating signal level variable from the output signal of the output unit 140 (S107).

Here, the operating signal level variable may include at least one among voltage of each level V1, V2, V3, and V4, a first level control variable EH1, a second level control variable EH2, and a third level control variable EH3 corresponding to the voltage gap, an average voltage Vavg, a minimum signal level Smin=min(EH1, EH2, EH3)/2, and a level separation mismatch ratio RLM=6× Smin/(V4-V1). Ideally, the RLM is calculated as 1, and generally, the required specification for 100 GbE PAM-4 signal processing is an RLM of 0.92 or higher.

Thereafter, the linearity control unit 150 gradually varies the gate voltage and the source voltage biased for each of the NMOS and the PMOS of the auxiliary amplifier so that the first level control variable EH1, the second level control variable EH2, and the third level control variable EH3 may be calibrated to be equal (S109).

For gradual variation, the linearity control unit 150 may first determine whether the condition is a first condition corresponding to EH2>EH1>EH3 or a second condition corresponding to EH2>EH3>EH1.

Then, when the condition corresponds to the first condition or the second condition, the linearity control unit 150 may perform the gradual variation processing in two ways.

1) A method of calibrating VGn of the NMOS included in the auxiliary amplifier 130 to be higher than VSn until EH2=EH1, and then calibrating VGp of the PMOS included in the auxiliary amplifier 130 to be lower than VSp until EH2=EH1=EH3.

2) A method of calibrating VGp of the PMOS included in the auxiliary amplifier 130 to be lower than VSp until EH2=EH3, and then calibrating VGn of the PMOS included in the auxiliary amplifier 130 to be higher than VSn until EH2=EH3=EH1.

The operating point voltages of n1 and p1 biased to equally set the first level control variable EH1, the second level control variable EH2, and the third level control variable EH3 may be automatically calibrated to the auxiliary amplifier 130 by the calibration process of the linearity control unit 150.

According to an embodiment of the present invention, there is provided an auxiliary amplifier connected in parallel with the main amplifier between the input unit and the output unit to variably amplify at least a portion of an input signal and apply the signal to the output unit according to a linearity improvement control signal corresponding to the output signal.

Therefore, according to an embodiment of the present invention, it is possible to provide a pulse amplitude modulation signal processing circuit for improving linearity of a nonlinear level pulse amplitude modulation signal, and a communication device including the same, which can lower the BER, improve communication sensitivity and data processing speed, and also improve communication speed, by improving linearity of a circuit that processes N-level pulse amplitude modulation (PAM-N) signals.

Meanwhile, various embodiments described herein may be implemented in a computer-readable recording medium using, for example, software, hardware, or a combination thereof. According to hardware implementation, the embodiments described herein may be implemented using at least one among application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, and electrical units for performing a function. In some cases, such embodiments may be implemented by a control unit.

In addition, the embodiments described above may be implemented by a hardware component, a software component, and/or a combination of the hardware component and the software component. For example, the devices, methods, and components described in the embodiments may be implemented using one or more general purpose computers or special purpose computers, such as a processor, a controller, a central processing unit (CPU), a graphics processing unit (GPU), an arithmetic logic unit (ALU), a digital signal processor, a microcomputer, a field programmable gate array (FPGA), a programmable logic unit (PLU), a microprocessor, an application specific integrated circuit (ASIC), and any other devices capable of executing instructions and responding thereto.

In addition, the method according to the present invention described above may be manufactured as a program to be executed on a computer and stored in a computer-readable recording medium, and examples of the computer-readable recording medium include ROM, RAM, CD-ROM, magnetic tapes, floppy disks, optical data storage devices and the like.

The computer-readable recording medium may be distributed in computer systems connected through a network so that computer-readable codes may be stored and executed in a distributed manner. In addition, functional programs, codes, and code segments for implementing the method may be easily inferred by programmers in the art to which the present invention belongs.

In addition, although preferred embodiments of the present invention have been illustrated and described above, the present invention is not limited to the specific embodiments described above, and various modified embodiments can be made by those skilled in the art without departing from the gist of the present invention claimed in the claims, and in addition, these modified embodiments should not be understood individually from the spirit or perspective of the present invention.

What is claimed is:

1. A circuit for processing an N-level pulse amplitude modulation (PAM-N) signal, the circuit comprising:
    an input unit for receiving an input signal;
    a main amplifier, connected to the input unit, for amplifying the input signal with a first gain; and
    an output unit for outputting an output signal of the main amplifier, wherein
    the circuit further comprises an auxiliary amplifier, connected in parallel with the main amplifier between the input unit and the output unit, for variably amplifying at least a portion of the input signal and applying a variably-amplified signal to the output unit according to a linearity improvement control signal corresponding to the output signal.

2. The circuit according to claim 1, further comprising a linearity control unit for measuring a preset operating signal level variable from the output signal of the output unit, generating the linearity improvement control signal based on the operating signal level variable, and applying the linearity improvement control signal to the auxiliary amplifier.

3. The circuit according to claim 2, wherein the operating signal level variable is calculated based on voltage levels of the PAM-N signal and an eye height between the voltage levels.

4. The circuit according to claim 3, wherein the linearity improvement control signal includes a control signal for shifting an operating point of the auxiliary amplifier in a direction equally calibrating the eye height between the voltage levels.

5. The circuit according to claim 1, wherein the auxiliary amplifier includes:
- a first capacitor and a second capacitor, one end of which is connected to the input unit, connected to each other in parallel for decoupling a direct current (DC) voltage of the input signal;
- a P-type MOSFET (PMOS) circuit having a gate connected to the other end of the first capacitor, for receiving a first bias voltage based on the decoupled input signal and the linearity improvement control signal through the gate, and variably amplifying and outputting drain current to the output unit; and
- an N-type MOSFET (NMOS) circuit having a gate connected to the other end of the second capacitor, for receiving a second bias voltage based on the decoupled input signal and the linearity improvement control signal through the gate, and variably amplifying and outputting drain current to the output unit.

6. The circuit according to claim 1, wherein the auxiliary amplifier includes a complementary Metal-Oxide Semiconductor (CMOS) inverter circuit complementarily connecting an N-type MOSFET (NMOS) and a P-type MOSFET (PMOS), drains of which are connected to the output unit, and receives a first bias voltage and a second bias voltage based on the input signal of the input unit and the linearity improvement control signal through gates of the NMOS and the PMOS respectively to variably control current of the drains.

7. The circuit according to claim 1, wherein the auxiliary amplifier is connected between the input unit and the output unit without separate decoupling capacitance, and includes an operating point shift circuit that combines an N-type MOSFET (NMOS) and a P-type MOSFET (PMOS), in which a threshold voltage is varied as bulk voltage based on the linearity improvement control signal is applied.

8. The circuit according to claim 1, further comprising a linearity control unit for measuring a calibration variable from the output signal of the output unit, and calibrating bias voltage applied to the auxiliary amplifier for the linearity improvement control signal on the basis of the calibration variable, while the main amplifier is turned on and the auxiliary amplifier is turned off.

9. A communication device for receiving a N-level pulse amplitude modulation (PAM-N) signal through an optical communication network, the device comprising:
- a PAM signal processing circuit for calibrating linearity by processing the PAM-N signal; and
- a receiving unit for receiving a signal, linearity of which is calibrated by the PAM signal processing circuit, wherein the PAM signal processing circuit includes:
- an input unit for receiving an input signal;
- a main amplifier, connected to the input unit, for amplifying the input signal with a first gain; and
- an output unit for outputting an output signal of the main amplifier, wherein the PAM signal processing circuit further comprises an auxiliary amplifier, connected in parallel with the main amplifier between the input unit and the output unit, for variably amplifying at least a portion of the input signal and applying a variably-amplified signal to the output unit according to a linearity improvement control signal corresponding to the output signal.

* * * * *